United States Patent
Kiyota

(10) Patent No.: US 7,664,158 B2
(45) Date of Patent: Feb. 16, 2010

(54) TWO-DIMENSIONAL PHOTONIC CRYSTAL SURFACE-EMITTING LASER

(75) Inventor: Kazuaki Kiyota, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 29 days.

(21) Appl. No.: 12/166,595

(22) Filed: Jul. 2, 2008

(65) Prior Publication Data
US 2009/0010298 A1 Jan. 8, 2009

Related U.S. Application Data

(63) Continuation of application No. PCT/JP2007/050818, filed on Jan. 19, 2007.

(30) Foreign Application Priority Data
Feb. 3, 2006 (JP) ............... 2006-027236

(51) Int. Cl.
*H01S 5/00* (2006.01)
*H01S 3/08* (2006.01)
(52) U.S. Cl. .................... 372/96; 372/50.124
(58) Field of Classification Search ............ 372/50.124, 372/96
See application file for complete search history.

(56) References Cited

U.S. PATENT DOCUMENTS
2004/0247009 A1 12/2004 Noda et al.
2006/0245464 A1 11/2006 Hori et al.

FOREIGN PATENT DOCUMENTS

| EP | 1 610 427 A1 | 12/2005 |
|---|---|---|
| JP | 2000-332351 A | 11/2000 |
| JP | 2003-23193 A | 1/2003 |
| JP | 2004-296538 A | 10/2004 |
| JP | 2006-332598 A | 12/2006 |
| JP | 2006-344619 A | 12/2006 |

OTHER PUBLICATIONS

U.S. Appl. No. 12/170,456, filed Jul. 10, 2008, Kiyota, et al.

*Primary Examiner*—Armando Rodriguez
(74) *Attorney, Agent, or Firm*—Oblon, Spivak, McClelland, Maier & Neustadt, L.L.P.

(57) ABSTRACT

A two-dimensional photonic crystal formed by arranging in a lattice pattern a medium having a refractive index different from that of a medium layer formed near an active layer. The two-dimensional photonic crystal includes a distributed-feedback control photonic crystal in which a light propagating through the active layer as a core is subjected to a two-dimensional distributed feedback within a plane of the active layer, and the light is not radiated in a direction normal to the plane of the active layer, and a surface-emission control photonic crystal in which the light is radiated in the direction normal to the plane of the active layer, which are superimposed with each other.

15 Claims, 7 Drawing Sheets

TWO-DIMENSIONAL PHOTONIC CRYSTAL SURFACE-EMITTING LASER

CROSS-REFERENCE TO RELATED APPLICATIONS

This application is a continuation of PCT/JP2007/050818 filed on Jan. 19, 2007, the entire content of which are incorporated herein by reference.

BACKGROUND OF THE INVENTION

1. Field of the Invention

The present invention relates to a two-dimensional photonic crystal surface-emitting laser.

2. Description of the Related Art

Photonic crystals are periodic optical structures formed by arranging a medium having a refractive index different from a refractive index of, for example, semiconductor, with a period on the order of wavelength of light, and applications thereof to various optical devices are being studied.

Examples of the optical devices using the photonic crystals include a two-dimensional photonic crystal surface-emitting laser. Conventional two-dimensional photonic crystal surface-emitting lasers are disclosed in, for example, Japanese Patent Application Laid-open No. 2000-332351, Japanese Patent Application Laid-open No. 2003-23193, and Japanese Patent Application Laid-open No. 2004-296538. For example, FIG. 11 is an exploded perspective view of a two-dimensional photonic crystal surface-emitting laser 100' disclosed in Japanese Patent Application Laid-open No. 2000-332351. The two-dimensional photonic crystal surface-emitting laser 100' includes a confinement layer 102', a lower cladding layer 103', an active layer 104', and an upper cladding layer 105' grown in that order on a substrate 101'. The confinement layer 102' is formed of n-InP semiconductor and contains air holes 108' formed in a square-lattice pattern arrayed at a predetermined two-dimensional period. Thus, the air holes 108' form a photonic crystal in which air medium having a refractive index different from that of the n-InP semiconductor is arrayed periodically. The active layer 104' has a multiple-quantum well (MQW) structure using GaInAsP semiconductor material and emits a light when a carrier is injected into the active layer 104'. The lower cladding layer 103' is formed of n-InP semiconductor and the like. The upper cladding layer 105' is formed of p-InP semiconductor. The lower cladding layer 103' and the upper cladding layer 105' sandwich the active layer 104', and thereby a double heterojunction is formed to confine the carrier. Thus, the carrier that contributes to light emission is confined in the active layer 104'. In this state, an electrode 106' made of Au is formed on a top surface of the upper cladding layer 105' and an electrode 107' made of Au is formed on a bottom surface of the substrate 101'.

When a voltage is applied between the electrodes 106' and 107', the active layer 104' emits a light, so that a light spreading as an evanescent wave from the active layer 104' is distributed in the two-dimensional photonic crystal formed in the confinement layer 102'. The two-dimensional photonic crystal has a two-dimensional distributed feedback effect. Therefore, similar to a distributed-feedback laser using a typical one-dimensional grating, laser oscillation occurs with the two-dimensional photonic crystal. Furthermore, the distributed-feedback effect of the two-dimensional photonic crystal occurs two dimensionally, so that a coherent single-mode oscillation occurs over a large area of the two-dimensional plane. As a result, surface emission occurs with a single-mode laser light. Principles of the two-dimensional distributed feedback and the surface emission of the two-dimensional photonic crystal surface-emitting laser 100' are described below in relation to a wave number space of the two-dimensional photonic crystal.

A light that can distributed feedback-operate in the two-dimensional square-lattice photonic crystal operates at X-point, M-point, and Γ-point among symmetric points in a reciprocal lattice space (wave number space) of the photonic crystal. The Γ-point is a point at which a wave number vector k is represented by $k=pb_1+qb_2$, where p and q are arbitrary integers and $b_1$ and $b_2$ are reciprocal primitive vectors with minimum magnitudes in a square-lattice. The reciprocal primitive vectors $b_1$ and $b_2$ are perpendicular to each other and their magnitudes are $2\pi/a$ where "a" is a lattice constant of the photonic crystal. Similarly, the X-point is a point at which a wave number vector k is represented by either $k=(p+(½))b_1+qb_2$ or $k=pb_1+(q+(½))b_2$. The M-point is a point at which a wave number vector k is represented by $k=(p+(½))b_1+(q+(½))b_2$.

On the other hand, a light that can distributed feedback-operate in the two-dimensional triangular-lattice photonic crystal operates at M-point, K-point, and Γ-point among symmetric points in a wave number space of the photonic crystal. The Γ-point is a point at which a wave number vector k is represented by $k=pb_1+qb_2$, where p and q are arbitrary integers and $b_1$ and $b_2$ are reciprocal primitive vectors with minimum magnitudes in a triangular-lattice. In this case, the reciprocal primitive vector $b_1$ and $b_2$ make an angle of 60 degrees therebetween, and their magnitudes are $4\pi/(\sqrt{3}a)$ where "a" is a lattice constant of the photonic crystal. Similarly, the M-point is a point at which a wave number vector k is represented by one of $k=(p+(½))b_1+qb_1$, $k=pb_1+(q+(½))b_2$ and $k=(p-(½))b_1+(q+(½))b_2$. The K-point is a point at which a wave number vector k is represented by either $k=(p+(⅓))b_1+(q+(⅓))b_2$ or $k=(p-(⅓))b_1+(q+(⅔))b_2$.

The two-dimensional photonic crystal surface-emitting lasers disclosed in Japanese Patent Application Laid-open No. 2000-332351 employs the Γ-point of either the two-dimensional square-lattice photonic crystal or the two-dimensional triangular-lattice photonic crystal as an operating point of two-dimensional distributed feedback.

A principle of the two-dimensional distributed feedback is described in relation to diffraction of a light by a photonic crystal lattice. The diffraction of a light in a periodic structure such as a crystal lattice means that a light with a wave number vector k changes to a light with a wave number vector of $k'=k+p'b_1+q'b_2$, where p' and q' are arbitrary integers and $b_1$ and $b_2$ are reciprocal primitive vectors. Assuming that a light with a wave number vector $k=pb_1+qb_2$, that is, a light at the Γ-point, is diffracted such that $p'=-2p$ and $q'=-2q$ are satisfied, a light after diffraction has a wave number vector $k'=-k$. That is, the light at the Γ-point is coupled with a wave that travels in a direction opposite to a direction of a light before diffraction. Because lights that travel in opposite directions are coupled with each other, distributed feedback occurs. When a light is diffracted such that $p'=-p+q$ and $q'=-q-p$ are satisfied, a wave number vector of a diffracted light is represented by $k'=qb_1-pb_2$. In this state, the light is coupled with a wave tilted by 90 degrees from a light before diffraction in the case of a square-lattice, and with a wave tilted by 120 degrees from a light before diffraction in the case of a triangular-lattice. Furthermore, when a light is diffracted such that $p'=-p-q$ and $q'=-q+p$ are satisfied, a wave number vector of a diffracted light is represented by $k'=-qb_1+pb_2$. In this state, the light is coupled with a wave tilted by −90 degrees from a light before diffraction in the case of a square-lattice, and with a wave tilted by −120 degrees from a light before diffraction in the case of a triangular-lattice. Thus, the light at the Γ-point is fed back to an original position, being diffracted at an arbitrary position on a crystal lattice and coupled with a wave that travels in the abovementioned predetermined direction. That is, the two-dimensional distributed feedback occurs with the light at the Γ-point.

A principle of the surface emission is also described in relation to diffraction of a light. When a light at the Γ-point is diffracted such that p'=−p and q'=−q are satisfied, k'=0 is obtained. The fact that a wave number vector k' in a two-dimensional in-plane is zero (k'=0) means that the light travels in a direction normal to a plane of a photonic crystal. That is, the light at the Γ-point has such property that surface emission occurs due to an effect of grating couple, with which the light is diffracted and travels in a direction normal to the plane of the photonic crystal. As a result, the light at the Γ-point distributed-feedbacks two-dimensionally, and surface-emits as well.

As described above, the two-dimensional photonic crystal surface-emitting laser causes surface emission with a light at the Γ-point in a wave number space of the photonic crystal formed on the confinement layer. The surface emission is achieved as a coherent single-mode laser light over a large area of a two-dimensional plane.

However, in the conventional two-dimensional photonic crystal surface-emitting lasers, if a two-dimensional distributed feedback effect of the photonic crystal structure is optimized to improve the in-plane optical confinement, the intensity of the surface emission decreases. On the other hand, if the surface emitting property of the photonic crystal structure is optimized to increase the intensity of the surface emission, the in-plane optical confinement degrades. Thus, the two-dimensional distributed feedback effect and the surface emitting property cannot independently be optimized.

SUMMARY OF THE INVENTION

It is an object of the present invention to at least partially solve the problems in the conventional technology.

According to an aspect of the present invention, there is provided a two-dimensional photonic crystal surface-emitting laser including an active layer that emits a light with a carrier injection; a medium layer formed near the active layer; and a two-dimensional photonic crystal formed by arranging a medium having a refractive index different from that of the medium layer in a lattice pattern. The two-dimensional photonic crystal includes a distributed-feedback control photonic crystal in which a light propagating through the active layer as a core is subjected to a two-dimensional distributed feedback within a plane of the active layer, and the light is not radiated in a direction normal to the plane of the active layer, and a surface-emission control photonic crystal in which the light is radiated in the direction normal to the plane of the active layer. The distributed-feedback control photonic crystal and the surface-emission control photonic crystal are superimposed with each other.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained below in detail with reference to the accompanying drawings. The present invention is not limited to the following embodiments.

A two-dimensional photonic crystal surface-emitting laser 100 according to a first embodiment of the present invention includes two types of square-lattice photonic crystals having different lattice constants and superimposed one on the other. The two-dimensional photonic crystal surface-emitting laser 100 emits from its surface a light with the vacuum wavelength of 980 nanometers.

Figure 1:
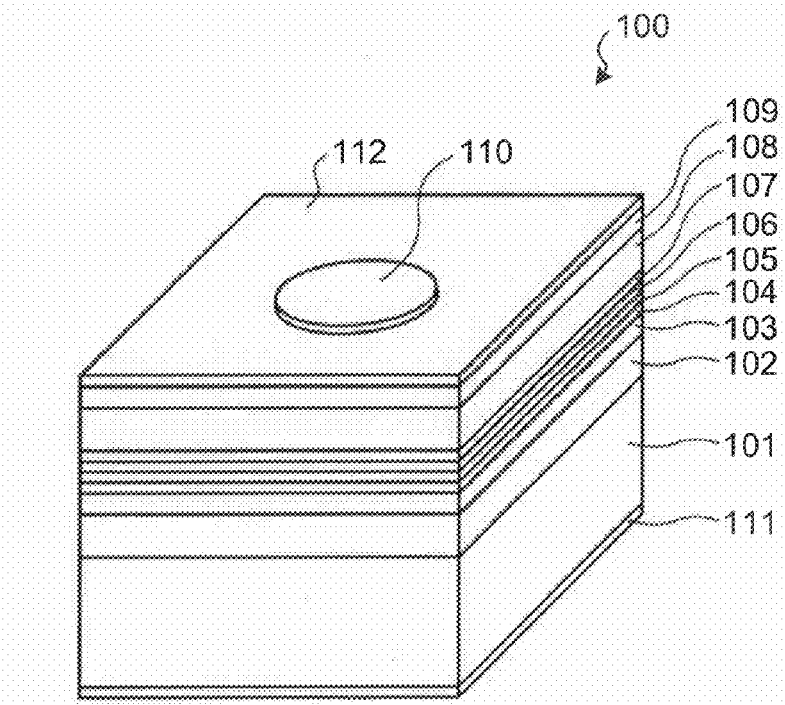
FIG. 1 is a perspective view of a two-dimensional photonic crystal surface-emitting laser according to a first embodiment of the present invention.
Figure 2:
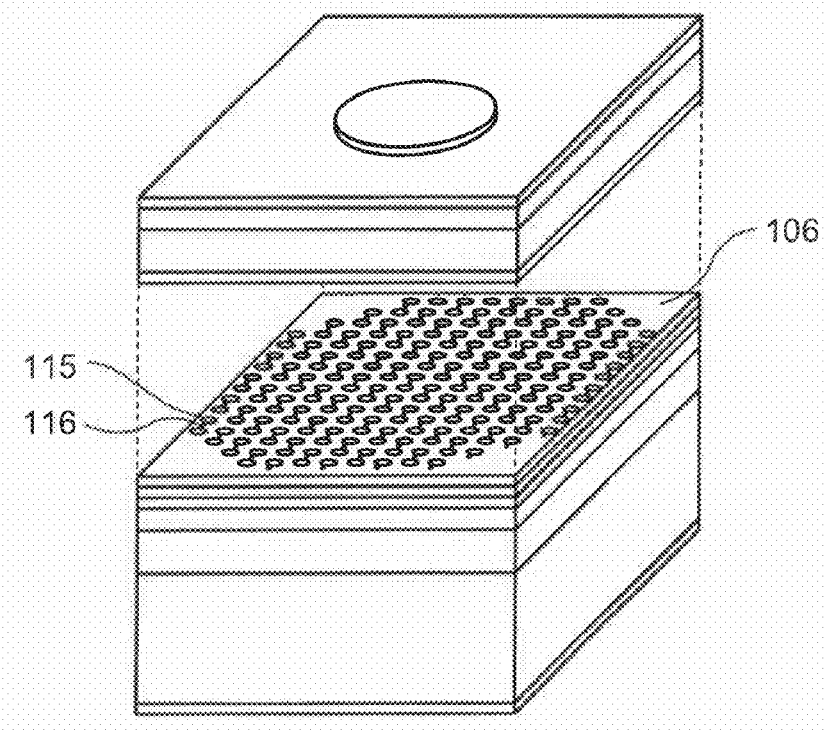
FIG. 2 is an exploded perspective view of the two-dimensional photonic crystal surface-emitting laser shown in FIG. 1.
Figure 3:
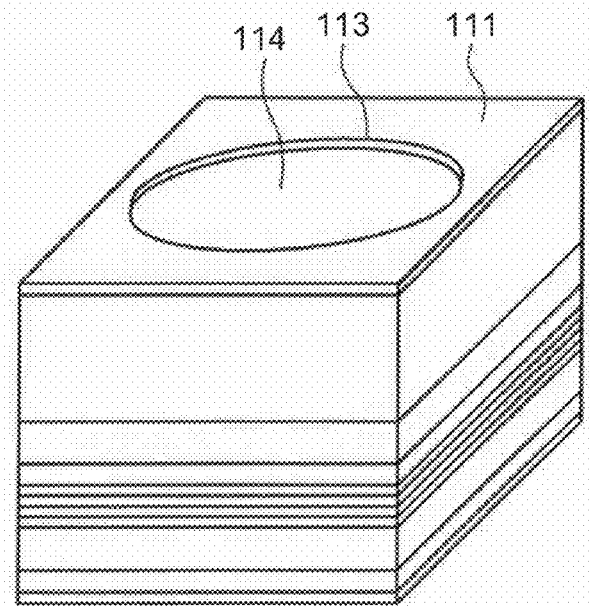
FIG. 3 is a perspective backside view of the two-dimensional photonic crystal surface-emitting laser shown in FIG. 1.

FIG. 1 is a perspective view of the two-dimensional photonic crystal surface-emitting laser 100; FIG. 2 is an exploded perspective view of the two-dimensional photonic crystal surface-emitting laser 100; and FIG. 3 is a perspective backside view of the two-dimensional photonic crystal surface-emitting laser 100. The two-dimensional photonic crystal surface-emitting laser 100 includes the following layers grown on an n-GaAs substrate 101. That is, an AlGaAs lower cladding layer 102 with a thickness of 4000 nanometers, a GaAs lower separate confinement layer 103 with a thickness of 100 nanometers, an InGaAs/GaAsP MQW active layer 104 with a thickness of 35 nanometers and a gain peak wavelength of 980 nanometers in terms of the vacuum wavelength, a GaAs upper separate confinement layer 105 with a thickness of 70 nanometers, a GaAs photonic crystal layer 106 with a thickness of 130 nanometers and containing photonic crystals, a GaAs spacer layer 107 with a thickness of 50 nanometers, an AlGaAs upper cladding layer 108 with a thickness of 2000 nanometers, and a GaAs contact layer 109 with a thickness of 4000 nanometers are grown on the n-GaAs substrate 101.

An upper electrode 110 of gold in a circular shape with a diameter of 50 micrometers is formed on an upper surface of the GaAs contact layer 109, and an insulating film 112 is arranged around the upper electrode 110. A lower electrode 111 of gold is formed on a bottom surface of the n-GaAs substrate 101. The lower electrode 111 includes an aperture 113 in a circular shape with a diameter of 100 micrometers. An antireflection coating film 114 of a dielectric material is formed on the aperture 113.

The two-dimensional photonic crystal surface-emitting laser 100 is manufactured by the following method. The AlGaAs lower cladding layer 102, the GaAs lower separate confinement layer 103, the InGaAs/GaAsP MQW active layer 104, and the GaAs upper separate confinement layer 105 are grown on the n-GaAs substrate 101 by metal organic chemical vapor deposition (MOCVD) or molecular beam epitaxy (MBE). Meanwhile, an AlGaAs etch-stop layer (not shown), the GaAs contact layer 109, the AlGaAs upper cladding layer 108, the GaAs spacer layer 107, and the GaAs photonic crystal layer 106 are grown on a p-GaAs substrate (not shown) by MOCVD or MBE.

A resist pattern is formed on the p-GaAs substrate (not shown) by electron beam lithography. The resist pattern is transferred onto the GaAs photonic crystal layer 106 to form air holes 115 and 116. Thereby, a two-dimensional photonic crystal in which a distributed-feedback control photonic crystal and a surface-emission control photonic crystal are superimposed one on the other is formed. The GaAs photonic crystal layer 106 on the surface of the p-GaAs substrate (not shown) and the GaAs upper separate confinement layer 105 on the surface of the n-GaAs substrate 101 are bonded together by wafer fusion. The p-GaAs substrate (not shown) is then removed by mechanical polishing and selective wet etching. The AlGaAs etch-stop layer (not shown) is also removed by selective wet etching. The upper electrode 110 is formed on the upper surface of the GaAs contact layer 109 and the lower electrode 111 is formed on the bottom surface of the n-GaAs substrate 101 by electron beam evaporation or a resistance heating evaporation. The insulating film 112 and the antireflection coating film 114 are formed by electron beam evaporation. The above obtained wafer is cut out in a predetermined size, resulting in the two-dimensional photonic crystal surface-emitting laser 100.

The GaAs photonic crystal layer 106 in the two-dimensional photonic crystal surface-emitting laser 100 manufactured in the above manner includes the circular air holes arrayed in a lattice pattern as media having a refractive index different from that of GaAs. Thus, a two-dimensional photonic crystal is formed in the GaAs photonic crystal layer 106.

Figure 4:
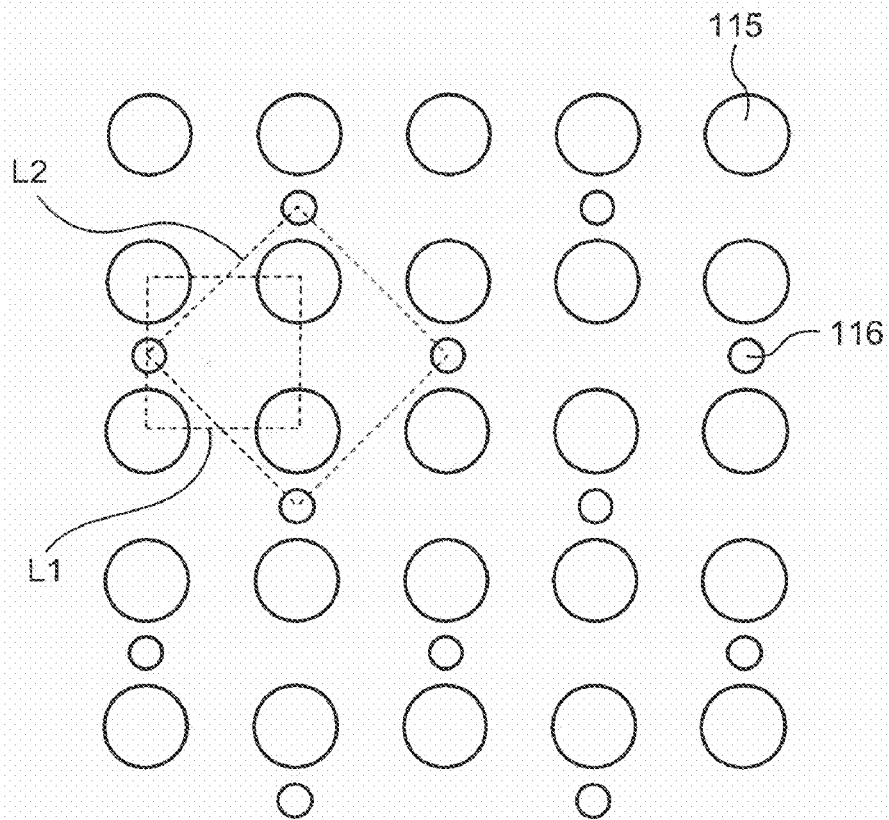
FIG. 4 is a plan view of a portion of a two-dimensional photonic crystal with air holes arrayed on a GaAs photonic crystal layer shown in FIG. 2.

FIG. 4 is a plan view of a portion of the two-dimensional photonic crystal with the air holes 115 and 116 arrayed on the GaAs photonic crystal layer 106. The air holes 115 form a distributed-feedback control photonic crystal with a lattice L1 as a primitive cell. The air holes 116 form a surface-emission control photonic crystal with a lattice L2 as a primitive cell. A lattice constant a1 of the lattice L1 is 205 nanometers. A radius of the air hole 115 is 49.2 nanometers, which is 0.24 times the lattice constant a1. A mode refractive index of a light that propagates in the InGaAs/GaAsP MQW active layer 104 is 3.37. Therefore, if a mode wavelength is defined as an effective wavelength of a light that propagates in the InGaAs/GaAsP MQW active layer 104 as a core, the mode wavelength of the light with the vacuum wavelength of 980 nanometers is 290 nanometers. That is, the lattice constant a1 of the lattice L1 corresponds to $1/\sqrt{2}$ times the mode wavelength of the light with the vacuum wavelength of 980 nanometers.

The lattice L2 is arrayed such that a crystal orientation of the lattice L2 is tilted by 45 degrees from a crystal orientation of the lattice L1. A lattice constant a2 of the lattice L2 is 290 nanometers that is equal to the mode wavelength of the light with the vacuum wavelength of 980 nanometers. A radius of the air holes 116 is 30.8 nanometers, which is 0.15 times the lattice constant a1. The air hole 116 is arrayed in the middle of a predetermined two of the air holes 115.

Principles of a two-dimensional distributed feedback and a surface emission of the photonic crystal according to the first embodiment are described below. As described above, the lattice constant a1 is $1/\sqrt{2}$ times the mode wavelength of the light with the vacuum wavelength of 980 nanometers. That is, the mode wavelength of the light is $\sqrt{2}a1$ and therefore, the magnitude of its wave number is $2\pi/(\sqrt{2}a1)$. Meanwhile, reciprocal primitive vectors $b_1$ and $b_2$ of the lattice L1 are $b_1=(2\pi/a1, 0)$ and $b_2=(0, 2\pi/a1)$. In this state, magnitude of wave number vector k at the M-point is represented by $k=(p+(\frac{1}{2}))b_1+(q+(\frac{1}{2}))b_2$. Therefore, when $p=q=0$ is assumed, $k=(\frac{1}{2})b_1+(\frac{1}{2})b_2=(\pi/a1, \pi/a1)$ is obtained, and thereby the magnitude of the wave number vector k becomes $2\pi/(\sqrt{2}a1)$. Thus, the magnitude of the wave number of the mode wavelength of the light is equal to the magnitude of the wave number vector at the M-point. As a result, the light with the vacuum wavelength of 980 nanometers operates at the M-point in relation to the distributed-feedback control photonic crystal.

When a light with the wave number vector corresponding to the wave number vector of $k=(\frac{1}{2})b_1+(\frac{1}{2})b_2$ at the M-point is diffracted due to a crystal lattice of the distributed-feedback control photonic crystal, the wave number vector changes to $k'=(p'+(\frac{1}{2}))b_1+(q'+(\frac{1}{2}))b_2$, where p' and q' are arbitrary integers. In this state, when the light is diffracted such that $p'=-1$ and $q'=-1$ are satisfied, k' equals to $-k$. Thus, the light with a wave number vector corresponding to the wave number vector at the M-point is coupled with a wave that travels in a direction opposite to a travelling direction of the light before diffraction. Furthermore, when $p'=0$ and $q'=-1$ are assumed, $k'=(\frac{1}{2})b_1-(\frac{1}{2})b_2$ is obtained, which means that the light with a wave number vector corresponding to the wave number vector at the M-point is coupled with a wave that travels in a direction tilted by 90 degrees from the travelling direction of the light before diffraction. Moreover, when $p'=-1$ and $q'=0$ are assumed, $k'=-(\frac{1}{2})b_1+(\frac{1}{2})b_2$ is obtained, which means that the light with a wave number vector corresponding to the wave number vector at the M-point is coupled with a wave that travels in a direction tilted by $-90$ degrees from the travelling direction of the light before diffraction. Thus, the light with the vacuum wavelength of 980 nanometers and thus a wave number vector corresponding to that at the M-point in a wave number space is subjected to two-dimensional distributed feedback by the distributed-feedback control photonic crystal, and thereby laser oscillation is achieved.

However, the wave number vector k' of the light after diffraction is not zero (k'=0) even when any integers are substituted for p' and q'. Therefore, surface emission does not occur by the distributed-feedback control photonic crystal.

A principle of a surface emission is described below. The crystal orientation of the lattice L2 of the surface-emission control photonic crystal is tilted by 45 degrees from the crystal orientation of the lattice L1 of the distributed-feedback control photonic crystal and the lattice constant of the lattice L2 is √2 times the lattice constant of the lattice L1. Thus, when reciprocal primitive vectors of the surface-emission control photonic crystal selected such that their magnitudes are minimum are represented by $b_1'$ and $b_2'$, they have the following relationship with the reciprocal primitive vectors $b_1$ and $b_2$ of the distributed-feedback photonic crystal. Specifically, $b_1'=(½)b_1+(½)b_2$ and $b_2'=-(½)b_1+(½)b_2$. In this state, a typical wave number vector k of a light obtained by laser oscillation due to distributed feedback by the distributed-feedback control photonic crystal, $k=(½)b_1+(½)b_2$, can be represented by $k=b_1'$. This corresponds to the case where p=1 and q=0 are assumed for a wave number vector k at the Γ-point in a reciprocal lattice space of the surface-emission control photonic crystal, where $k=pb_1'+qb_2'$. That is, the light obtained by laser oscillation due to distributed feedback by the distributed-feedback control photonic crystal operates at the Γ-point in relation to the surface-emission control photonic crystal.

As described above, the light having a wave number vector corresponding to that at the Γ-point is diffracted by the phonic crystal lattice to travel in a direction normal to a plane of the photonic crystal, and thereby surface emission occurs. That is, the light obtained by laser oscillation due to distributed feedback by the distributed-feedback control photonic crystal realizes surface emission by the surface-emission control photonic crystal.

Thus, the two-dimensional photonic crystal surface-emitting laser according to the first embodiment is formed such that the two-dimensional distributed feedback and the surface emission are realized using different photonic crystal lattices. Therefore, a structure of each of the photonic crystal lattices can be independently designed so that a two-dimensional distributed feedback effect and a surface emitting property are independently optimized. For example, a structure of the distributed-feedback control photonic crystal is designed to enhance a distributed feedback effect, and a structure of the surface-emission control photonic crystal is designed to increase intensity of surface emission by adjusting sizes of air holes.

A two-dimensional photonic crystal surface-emitting laser according to a second embodiment of the present invention is described below. The two-dimensional photonic crystal surface-emitting laser according to the second embodiment has a similar structure to that shown in FIG. 1 and can be manufactured by the same manufacturing method as that described in the first embodiment. However, a lattice constant and a crystal orientation of a surface-emission control photonic crystal formed on a GaAs photonic crystal layer are different from those described in the first embodiment.

Figure 5:
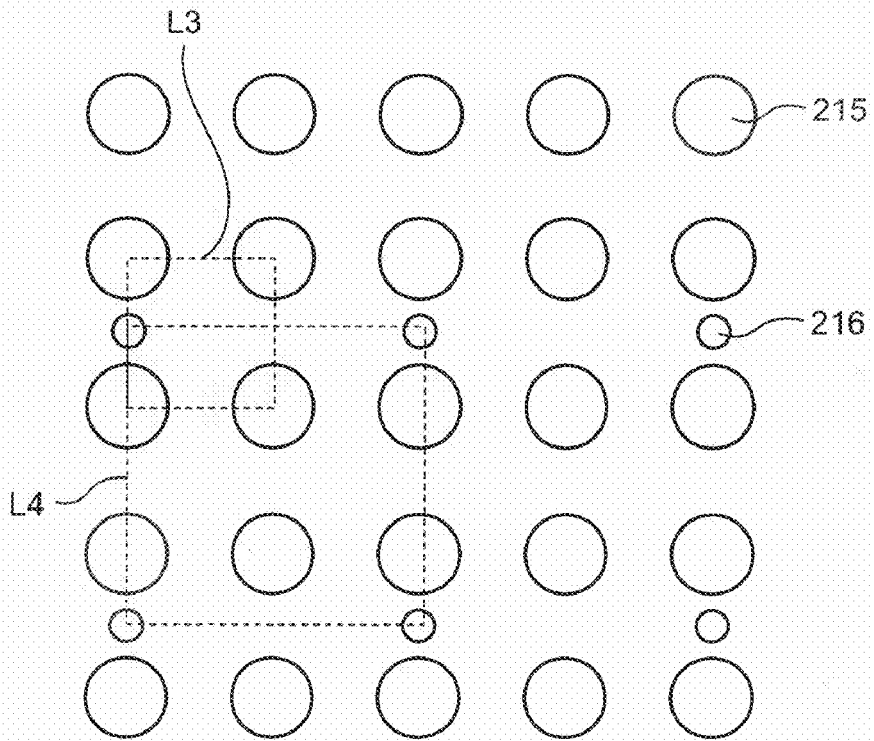
FIG. 5 is a plan view of a portion of a two-dimensional photonic crystal with air holes arrayed on a GaAs photonic crystal layer in a second embodiment of the present invention.

FIG. 5 is a plan view of a portion of a two-dimensional photonic crystal with air holes 215 and 216 arrayed on a GaAs photonic crystal layer of the two-dimensional photonic crystal surface-emitting laser according to the second embodiment. The air holes 215 form a distributed-feedback control photonic crystal with a lattice L3 as a primitive cell, and the air holes 216 form a surface-emission control photonic crystal with a lattice L4 as a primitive cell. Similar to the first embodiment, a lattice constant a1 of the lattice L3 is 205 nanometers and a radius of the air hole 215 is 49.2 nanometers, which is 0.24 times the lattice constant a1.

The lattice L4 is arrayed with the same crystal orientation as that of the lattice L3, and a lattice constant a2 of the lattice L4 is 410 nanometers. A radius of the air holes 216 is 30.8 nanometers, which is 0.15 times the lattice constant a1. The air hole 216 is arrayed in the middle of a predetermined two of the air holes 215.

Principles of two-dimensional distributed feedback and surface emission of the photonic crystal according to the second embodiment are described below. The distributed-feedback control photonic crystal with the lattice L3 as a primitive cell is a square-lattice and has a lattice constant equal to that of the distributed-feedback control photonic crystal of the first embodiment. Therefore, the light with the vacuum wavelength of 980 nanometers operates at the M-point in relation to the distributed-feedback control photonic crystal. Thus, the light with the vacuum wavelength of 980 nanometers and corresponding to the M-point is subjected to two-dimensional distributed feedback by the distributed-feedback control photonic crystal and thereby laser oscillation occurs. However, surface emission does not occur with the distributed-feedback control photonic crystal.

A principle of the surface emission is described below. The crystal orientation of the lattice L4 of the surface-emission control photonic crystal is the same as the crystal orientation of the lattice L3 of the distributed-feedback control photonic crystal and the lattice constant of the lattice L4 is twice the lattice constant of the lattice L3. Thus, when reciprocal primitive vectors of the surface-emission control photonic crystal selected such that their magnitudes are minimum are represented by $b_1'$ and $b_2'$, they have the following relationship with reciprocal primitive vectors $b_1$ and $b_2$ of the distributed-feedback photonic crystal. Specifically, $b_1'=(½)b_1$ and $b_2'=(½)b_1$. In this state, a typical wave number vector k of a light at the M-point obtained by laser oscillation due to distributed feedback by the distributed-feedback control photonic crystal, $k=(½)b_1+(½)b_2$, can be represented by $k=b_1'+b_2'$. This corresponds to the case where p=1 and q=1 are assumed for a wave number vector k of the Γ-point in a reciprocal lattice space of the surface-emission control photonic crystal, where $k=pb_1'+qb_2'$. That is, the light obtained by laser oscillation due to distributed feedback by the distributed-feedback control photonic crystal operates at the Γ-point in relation to the surface-emission control photonic crystal.

As a result, similar to the two-dimensional photonic crystal surface-emitting laser according to the first embodiment, the surface emission is achieved by the surface-emission control photonic crystal with the light obtained by laser oscillation due to distributed feedback by the distributed-feedback control photonic crystal. The two-dimensional photonic crystal surface-emitting laser according to the second embodiment is formed such that the two-dimensional distributed feedback and the surface emission are realized using different photonic crystal lattices. Therefore, a structure of each of the photonic crystal lattices can be independently designed so that a two-dimensional distributed feedback effect and a surface emitting property are independently optimized. For example, a structure of the distributed-feedback control photonic crystal is designed to enhance a distributed feedback effect, and a structure of the surface-emission control photonic crystal is designed to increase intensity of surface emission by adjusting sizes of air holes.

A two-dimensional photonic crystal surface-emitting laser according to a third embodiment of the present invention is described below. The two-dimensional photonic crystal surface-emitting laser according to the third embodiment has a similar structure to those described in the first and the second embodiments and can be manufactured by the same manufacturing method as those described in the first and the second embodiments. However, a surface-emission control photonic crystal formed on a GaAs photonic crystal layer is formed as a rectangular lattice with a lattice constant and a crystal orientation different from those described in the first and the second embodiments.

Figure 6:
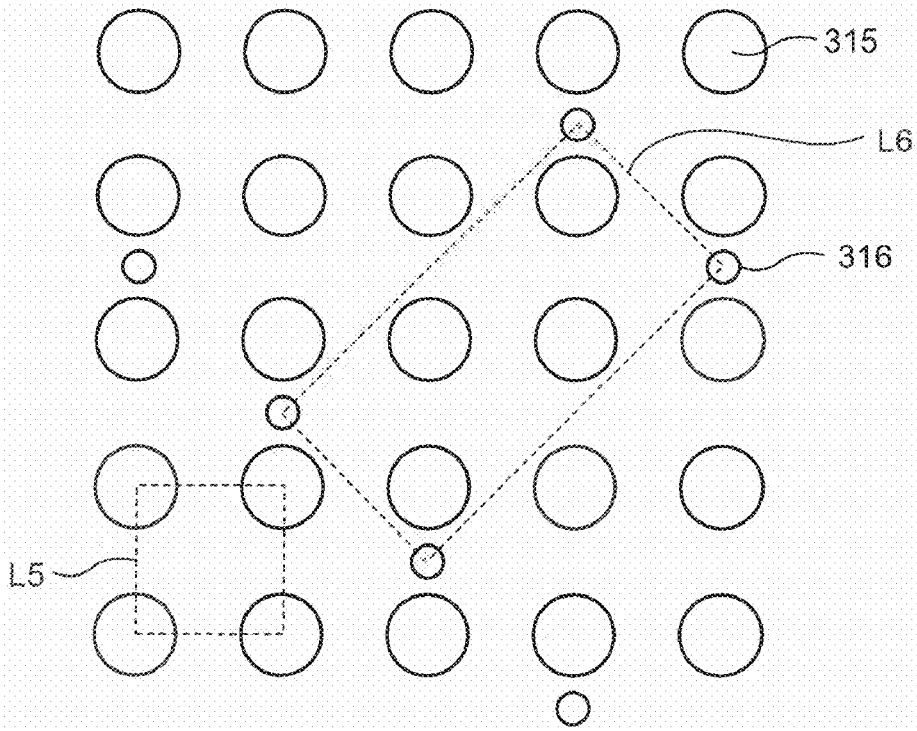
FIG. 6 is a plan view of a portion of a two-dimensional photonic crystal with air holes arrayed on a GaAs photonic crystal layer of the two-dimensional photonic crystal surface-emitting laser according to a third embodiment of the present invention.

FIG. 6 is a plan view of a portion of a two-dimensional photonic crystal with air holes 315 and 316 arrayed on a GaAs photonic crystal layer of the two-dimensional photonic crystal surface-emitting laser according to the third embodiment. The air holes 315 form a distributed-feedback control photonic crystal with a lattice L5 as a primitive cell, and the air holes 316 form a surface-emission control photonic crystal with a lattice L6 as a primitive cell. Similar to the first embodiment, a lattice constant a1 of the lattice L5 is 205 nanometers and a radius of the air hole 315 is 49.2 nanometers, which is 0.24 times the lattice constant a1.

The lattice L6 is arrayed such that a crystal orientation of the lattice L6 is tilted by 45 degrees from a crystal orientation of the lattice L5. A lattice constant a2 is 290 nanometers and a lattice constant a3 is 580 nanometers. A radius of the air holes 316 is 30.8 nanometers, which is 0.15 times the lattice constant a1. The air hole 316 is arrayed in the middle of a predetermined two of the air holes 315.

Principles of two-dimensional distributed feedback and surface emission of the photonic crystal according to the third embodiment are described below. Similar to the distributed-feedback control photonic crystals according to the first and the second embodiments, the distributed-feedback control photonic crystal with the lattice L5 as a primitive cell is formed as a square-lattice and has a lattice constant equal to those of the distributed-feedback control photonic crystal of the first and the second embodiments. Therefore, the light with the vacuum wavelength of 980 nanometers operates at the M-point in relation to the distributed-feedback control photonic crystal. Thus, the light with the vacuum wavelength of 980 nanometers at the M-point is subjected to two-dimensional distributed feedback by the distributed-feedback control photonic crystal and thereby laser oscillation occurs. However, surface emission does not occur by the distributed-feedback control photonic crystal.

As for a principle of a surface emission, similar to the first embodiment, a wave number vector of a light obtained by laser oscillation due to distributed feedback by the distributed-feedback control photonic crystal corresponds to a wave number vector at the Γ-point in a reciprocal lattice space of the surface-emission control photonic crystal. That is, the light obtained by laser oscillation due to distributed feedback by the distributed-feedback control photonic crystal operates at the Γ-point in relation to the surface-emission control photonic crystal.

As a result, similar to the two-dimensional photonic crystal surface-emitting laser according to the first embodiment, the surface emission is achieved by the surface-emission control photonic crystal with the light obtained by laser oscillation due to distributed feedback by the distributed-feedback control photonic crystal. Thus, the two-dimensional photonic crystal surface-emitting laser according to the third embodiment is formed such that surface emission and two-dimensional distributed feedback are realized using different photonic crystal lattices. Therefore, a structure of each of the photonic crystal lattices can be independently designed so that a two-dimensional distributed feedback effect and a surface emitting property are independently optimized. For example, a structure of the distributed-feedback control photonic crystal is designed to enhance a distributed feedback effect, and a structure of the surface-emission control photonic crystal is designed to increase intensity of surface emission by adjusting sizes of air holes.

In the two-dimensional photonic crystal surface-emitting laser according to the third embodiment, a rectangular-lattice photonic crystal is formed such that the air holes in a square-lattice of the surface-emission control photonic crystal of the two-dimensional photonic crystal surface-emitting laser according to the first embodiment are thinned out every second line. The rectangular-lattice or other-shaped-lattice photonic crystal may be formed by thinning out the air holes using other methods so that the light obtained by laser oscillation due to distributed feedback by the distributed-feedback control photonic crystal operates at the Γ-point in relation to the surface-emission control photonic crystal.

A two-dimensional photonic crystal surface-emitting laser according to a fourth embodiment of the present invention is described below. The two-dimensional photonic crystal surface-emitting laser according to the fourth embodiment has a similar structure to those described in the first to the third embodiments and can be manufactured by the above manufacturing method. However, the two-dimensional photonic crystal surface-emitting laser according to the fourth embodiment is unique in that it includes a photonic crystal in which two different types of triangular-lattices with different lattice constants are superimposed one on the other.

Figure 7:
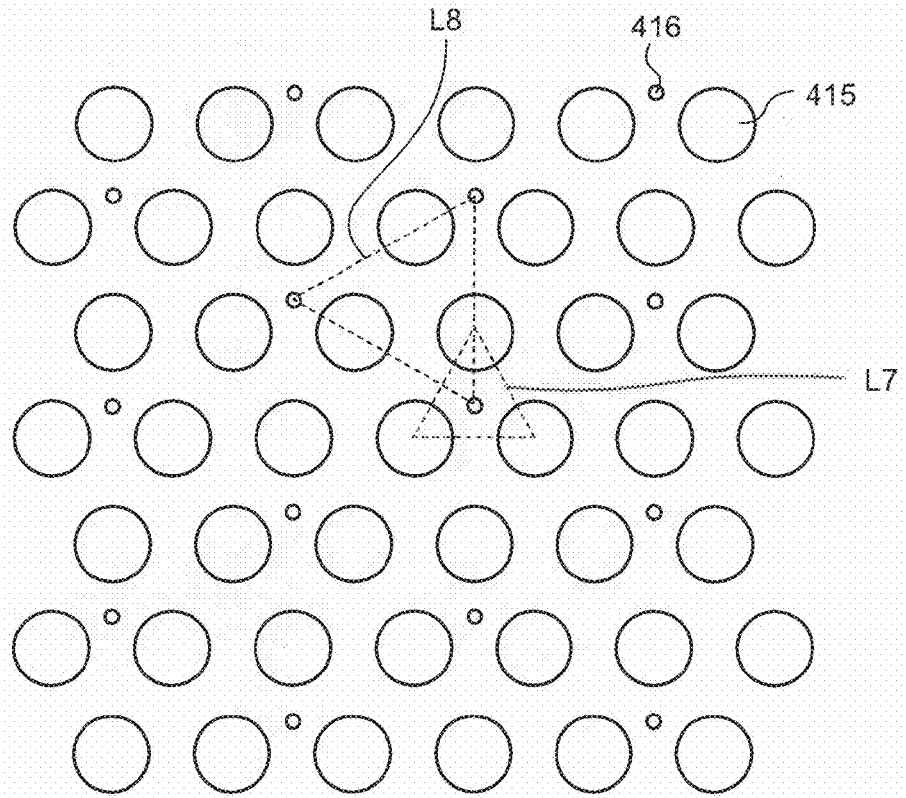
FIG. 7 is a plan view of a portion of a two-dimensional photonic crystal with air holes arrayed on a GaAs photonic crystal layer of the two-dimensional photonic crystal surface-emitting laser according to a fourth embodiment of the present invention.

FIG. 7 is a plan view of a portion of a two-dimensional photonic crystal with air holes 415 and 416 arrayed on a GaAs photonic crystal layer of the two-dimensional photonic crystal surface-emitting laser according to the fourth embodiment. The air holes 415 form a triangular-lattice distributed-feedback control photonic crystal with a lattice L7 as a primitive cell, and the air holes 416 form a triangular-lattice surface-emission control photonic crystal with a lattice L8 as a primitive cell. A lattice constant a1 of the lattice L7 is 194 nanometers and a radius of the air hole 415 is 42.7 nanometers, which is 0.22 times the lattice constant a1. A mode refractive index of a light that propagates in a InGaAs/GaAsP MQW active layer is 3.37. Therefore, a mode wavelength of the light with the vacuum wavelength of 980 nanometers that propagates in the InGaAs/GaAsP MQW active layer as a core is 290 nanometers. That is, the lattice constant a1 of the lattice L7 corresponds to 2/3 times the mode wavelength of the light with the vacuum wavelength of 980 nanometers.

The lattice L8 is arrayed such that a crystal orientation of the lattice L8 is tilted by 30 degrees from a crystal orientation of the lattice L7. A lattice constant a2 of the lattice L8 is 336 nanometers, which is 2√3/3 times a mode wavelength of the light with the vacuum wavelength of 980 nanometers. A radius of the air holes 416 is 29.1 nanometers, which is 0.15 times the lattice constant a1. The air hole 416 is located in the middle of predetermined two of the air holes 415. The position of the air hole 416 may be shifted from the middle of the predetermined two of the air holes 415.

Principles of two-dimensional distributed feedback and surface emission of the photonic crystal according to the fourth embodiment are described below. As described above, the lattice constant a1 of the lattice L7 of the distributed-feedback control photonic crystal corresponds to 2/3 times the mode wavelength of the light with the vacuum wavelength of 980 nanometers. Therefore, the mode wavelength is represented by $3a1\frac{1}{2}$ and magnitude of a wave number is $4\pi/(3a1)$. Meanwhile, a reciprocal primitive vector of the lattice L7 is represented by $b_1=(4\pi/(\sqrt{3}a1), 0)$ and $b_2=(2\pi/(\sqrt{3}a1), 2\pi/a1)$. A wave number vector at the K-point is represented by $k=(p+(1/3))b_1+(q+(1/3))b_2$. In this state, when $p=q=0$ is assumed, $k=(\frac{1}{3})b_1+(\frac{1}{3})b_2=(2\pi/(\sqrt{3}a1), 2\pi/(3a1))$ is obtained. Thus, the magnitude of the wave number vector k is $4\pi/(3a1)$ Because the magnitudes of the wave numbers of the mode wavelength and the magnitude of the wave number vector at the K-point are equal, the light with the vacuum wavelength of 980 nanometers operates at the K-point in relation to the distributed-feedback control photonic crystal.

When a light having a wave number vector corresponding to the wave number vector k at the K-point, where $k=(\frac{1}{3})b_1+(\frac{1}{3})b_2$, is diffracted by the distributed-feedback control photonic crystal, the wave number vector k changes to $k'=(p'+(\frac{1}{3}))b_1+(q'+(\frac{1}{3}))b_2$, where p' and q' are arbitrary integers. In this state, when the light is diffracted so that $p'=-1$ and $q'=0$ are satisfied, the wave number vector k changes to $k'=(-\frac{2}{3})b_1+(\frac{1}{3})b_2$, making an angle of 120 degrees with the wave number vector k of a light before diffraction. Therefore, a light with a wave number vector corresponding to the wave number vector at the K-point is coupled with a light that travels in a direction tilted by 120 degrees from the light before diffraction. Furthermore, when $p'=0$ and $q'=-1$ are assumed, the wave number vector k changes to $k'=(\frac{1}{3})b_1-(\frac{2}{3})b_2$. Therefore, the light is coupled with a light that travels in a direction tilted by 120 degrees from the light before diffraction. Thus, the light with the vacuum wavelength of 980 nanometers is subjected to a two-dimensional distributed feedback by the distributed-feedback control photonic crystal and the laser oscillation occurs.

However, the wave number vector k' of a diffracted light does not become $k'=0$ even when any integers are substituted for p' and q'. Therefore, surface emission does not occur by the distributed-feedback control photonic crystal.

A principle of the surface emission according to the fourth embodiment is described below. A crystal orientation of the lattice L8 of the surface-emission control photonic crystal is tilted by 30 degrees from a crystal orientation of the lattice L7 of the distributed-feedback control photonic crystal and a lattice constant of the lattice L8 is $\sqrt{3}$ times a lattice constant of the lattice L7. Thus, when reciprocal primitive vectors of the surface-emission control photonic crystal selected such that their magnitudes are minimum are represented by $b_1'$ and $b_2'$, they have the following relationship with reciprocal primitive vectors $b_1$ and $b_2$ of the distributed-feedback photonic crystal. Specifically, $b_1'=(\frac{1}{3})b_1+(\frac{1}{3})b_2$ and $b_2'=(\frac{1}{3})b_1-(\frac{2}{3})b_2$. In this state, a typical wave number vector k of a light obtained by laser oscillation due to distributed feedback by the distributed-feedback control photonic crystal, $k=(\frac{1}{3})b_1+(\frac{1}{3})b_2$, can be represented by $k=b_1'$. This corresponds to the case where $p=1$ and $q=0$ are assumed for a wave number vector k at the Γ-point in a reciprocal lattice space of the surface-emission control photonic crystal, where $k=pb_1'+qb_2'$. That is, the light obtained by laser oscillation due to distributed feedback by the distributed-feedback control photonic crystal operates at the Γ-point in relation to the surface-emission control photonic crystal.

As a result, similar to the two-dimensional photonic crystal surface-emitting lasers according to the first to the third embodiments, the surface emission is achieved by the surface-emission control photonic crystal with the light obtained by laser oscillation due to distributed feedback by the distributed-feedback control photonic crystal. Thus, the two-dimensional photonic crystal surface-emitting laser according to the fourth embodiment is formed such that surface emission and two-dimensional distributed feedback are realized using different photonic crystal lattices. Therefore, a structure of each of the photonic crystal lattices can be independently designed so that a two-dimensional distributed feedback effect and a surface emitting property are independently optimized. For example, a structure of the distributed-feedback control photonic crystal is designed to enhance a distributed feedback effect, and a structure of the surface-emission control photonic crystal is designed to increase intensity of surface emission by adjusting sizes of air holes.

A two-dimensional photonic crystal surface-emitting laser according to a fifth embodiment of the present invention is described below. The two-dimensional photonic crystal surface-emitting laser according to the fifth embodiment has a similar structure to that described in the fourth embodiments and can be manufactured by the above manufacturing method. However, in the two-dimensional photonic crystal surface-emitting laser according to the fifth embodiment, a lattice constant and a crystal orientation of a surface-emission control photonic crystal formed on a GaAs photonic crystal layer are different from that in the fourth embodiments.

Figure 8:
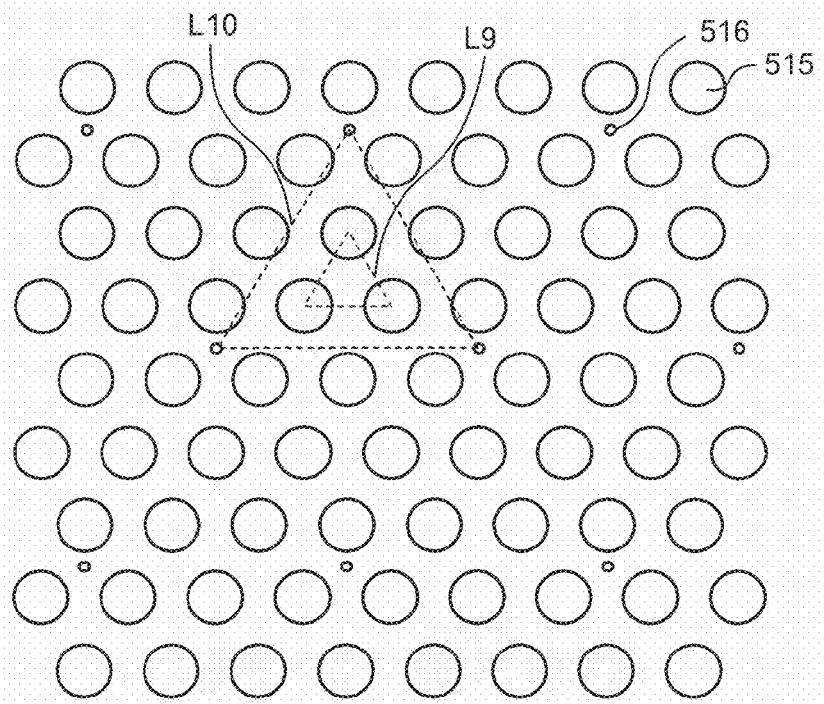
FIG. 8 is a plan view of a portion of a two-dimensional photonic crystal with air holes arrayed on a GaAs photonic crystal layer of the two-dimensional photonic crystal surface-emitting laser according to a fifth embodiment of the present invention.

FIG. 8 is a plan view of a portion of a two-dimensional photonic crystal with air holes 515 and 516 arrayed on a GaAs photonic crystal layer of the two-dimensional photonic crystal surface-emitting laser according to the fifth embodiment. The air holes 515 form a distributed-feedback control photonic crystal with a lattice L9 as a primitive cell, and the air holes 516 form a surface-emission control photonic crystal with a lattice L10 as a primitive cell. Similar to the distributed-feedback control photonic crystal of the fourth embodiment, a lattice constant a1 of the lattice L9 is 194 nanometers and a radius of the air hole 515 is 49.2 nanometers, which is 0.24 times the lattice constant a1.

The lattice L10 has the same crystal orientation as that of the lattice L9 and a lattice constant a2 of the lattice L10 is 388 nanometers. A radius of the air holes 516 is 30.8 nanometers which is 0.15 times the lattice constant a1. The air hole 516 is located in the middle of predetermined two of the air holes 515. The position of the air hole 516 may be shifted from the middle of the predetermined two of the air holes 515.

Principles of two-dimensional distributed feedback and surface emission of the photonic crystal according to the fifth embodiment are described below. Similar to the distributed-feedback control photonic crystal according to the fourth embodiment, the distributed-feedback control photonic crystal with the lattice L9 as a primitive cell is formed as a triangular-lattice with the same lattice constant as the fourth embodiment. Therefore, the light with the vacuum wavelength of 980 nanometers operates at the K-point in relation to the distributed-feedback control photonic crystal. Thus, the light with the vacuum wavelength of 980 nanometers at the K-point is subjected to two-dimensional distributed feedback by the distributed-feedback control photonic crystal and thereby laser oscillation occurs. However, surface emission does not occur by the distributed-feedback control photonic crystal.

A principle of the surface emission according to the fifth embodiment is described below. The crystal orientation of the lattice L10 of the surface-emission control photonic crystal is the same as the crystal orientation of the lattice L9 of the distributed-feedback control photonic crystal and a lattice constant of the lattice L10 is twice the lattice constant of the lattice L9. Thus, when reciprocal primitive vectors of the surface-emission control photonic crystal selected such that their magnitudes are minimum are represented by $b_1'$ and $b_2'$, they have the following relationship with reciprocal primitive vectors $b_1$ and $b_2$ of the distributed-feedback photonic crystal. Specifically, $b_1'=(\frac{1}{3})b_1$ and $b_2'=(\frac{1}{3})b_2$. In this state, a typical wave number vector k of a light obtained by laser oscillation due to distributed feedback by the distributed-feedback control photonic crystal, $k=(\frac{1}{3})b_1+(\frac{1}{3})b_2$, can be represented by $k=b_1'+b_2'$. This corresponds the case where $p=1$ and $q=1$ are assumed for a wave number vector k of the Γ-point in a reciprocal lattice space of the surface-emission control photonic crystal, where k=pb$_1$'+qb$_2$'. That is, the light obtained by laser oscillation due to distributed feedback by the distributed-feedback control photonic crystal operates at the Γ-point in relation to the surface-emission control photonic crystal.

As a result, similar to the two-dimensional photonic crystal surface-emitting laser according to the fourth embodiment, the surface emission is achieved by the surface-emission control photonic crystal with the light obtained by laser oscillation due to distributed feedback by the distributed-feedback control photonic crystal. Thus, the two-dimensional photonic crystal surface-emitting laser according to the fifth embodiment is formed such that the two-dimensional distributed feedback and the surface emission are realized using different photonic crystal lattices. Therefore, a structure of each of the photonic crystal lattices can be independently designed so that a two-dimensional distributed feedback effect and a surface emitting property are independently optimized. For example, a structure of the distributed-feedback control photonic crystal is designed to enhance a distributed feedback effect, and a structure of the surface-emission control photonic crystal is designed to increase intensity of surface emission by adjusting sizes of air holes.

A two-dimensional photonic crystal surface-emitting laser according to a sixth embodiment of the present invention is described below. The two-dimensional photonic crystal surface-emitting laser according to the sixth embodiment has a similar structure to that described in the first embodiment shown in FIG. 1 and can be manufactured by the same manufacturing method. However, in the two-dimensional photonic crystal surface-emitting laser according to the sixth embodiment, air holes that form a surface-emission photonic crystal formed on a GaAs photonic crystal layer have different sizes depending on positions in a plane direction of the GaAs photonic crystal layer.

Figure 9:
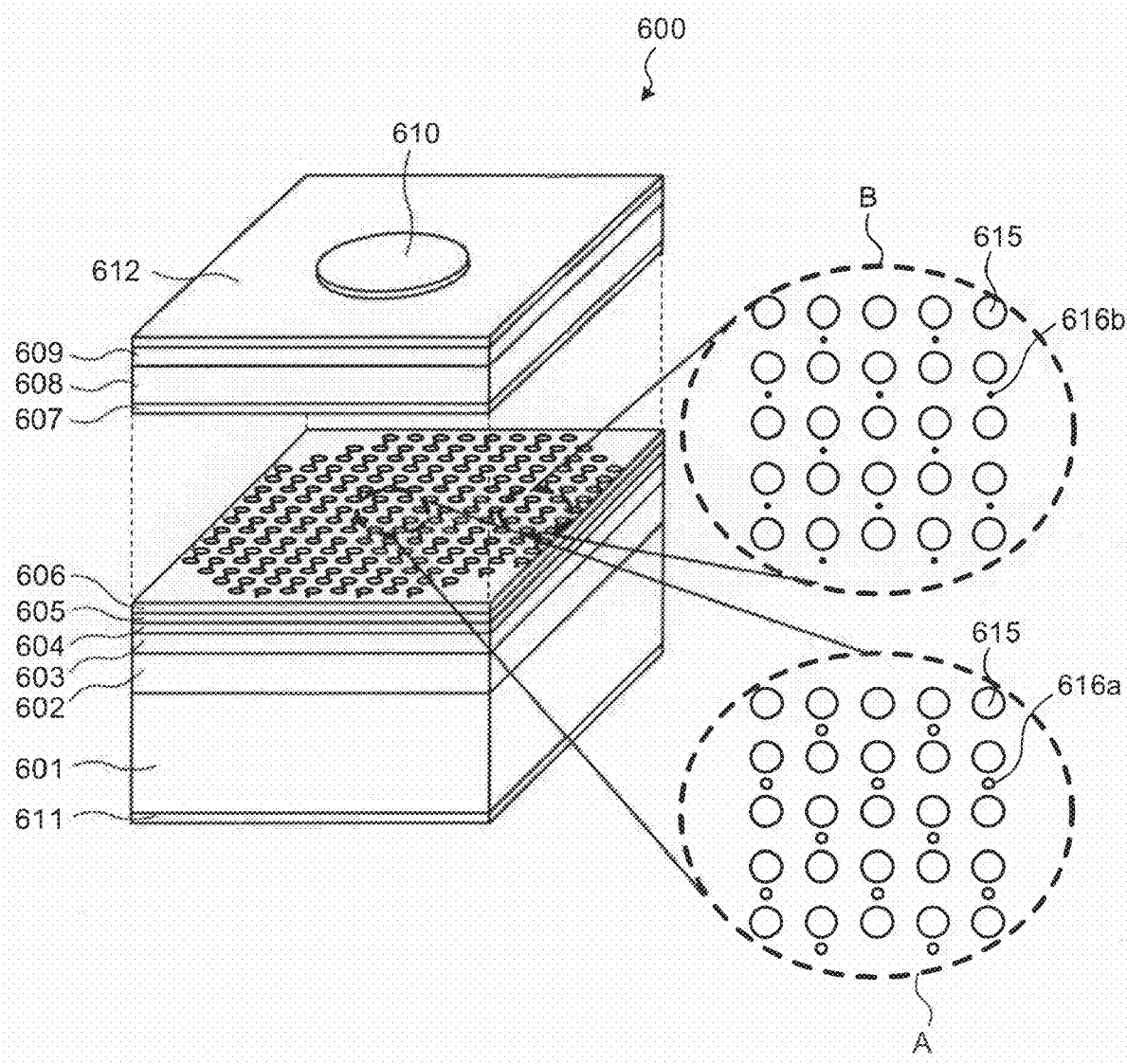
FIG. 9 is an exploded perspective view of a two-dimensional photonic crystal surface-emitting laser according to a sixth embodiment of the present invention.

FIG. 9 is an exploded perspective view of a two-dimensional photonic crystal surface-emitting laser 600 according to the sixth embodiment, wherein an in-plane center portion and a peripheral portion of the GaAs photonic crystal layer 606 are enlarged. The two-dimensional photonic crystal surface-emitting laser 600 has a similar structure to that of the two-dimensional photonic crystal surface-emitting laser 100 according to the first embodiment. Air holes 615 that form a distributed-feedback control photonic crystal are formed as a square-lattice with a lattice constant equal to that of the air holes 115 in the two-dimensional photonic crystal surface-emitting laser 100 according to the first embodiment. A radius of the air hole 615 is 49.2 nanometers, which is 0.24 times the lattice constant a1, and uniform regardless of in-plane positions in the GaAs photonic crystal layer 606.

Air holes 616 that form a surface-emission control photonic crystal are formed as a square-lattice with a lattice constant equal to that of the air holes 116 in the two-dimensional photonic crystal surface-emitting laser 100 according to the first embodiment, and with the same crystal orientation as the first embodiment. However, radiuses of the air holes 616 are different depending on the in-plane positions in the GaAs photonic crystal layer 606. In FIG. 9, in a dotted-line circle indicated by a reference symbol A, the air holes 615 and air holes 616a on a center portion in the in-plane direction of the GaAs photonic crystal layer 606 are shown; and in a dotted-line circle indicated by a reference symbol B, the air holes 615 and air holes 616b on a peripheral portion are shown. A radius of the air hole 616b that form the peripheral portion of the surface-emission control photonic crystal is smaller than a radius of the air hole 616a that form the center portion of the surface-emission control photonic crystal. Specifically, a radius of the air hole in the center portion is 32.8 nanometers which is 0.16 times the lattice constant a1 of the lattice L1, that is, 205 nanometers, and a radius exponentially decreases with an in-plane distance from the center portion to the peripheral portion. A radius of an air hole on a position 50 micrometers away from the center portion is 16.4 nanometers, which is a half of that on the center portion.

By setting the radius of the air holes of the surface-emission control photonic crystal such that the radius of the air holes on the in-plane center portion of the photonic crystal layer are larger than the radius of the air holes on the peripheral portion, the surface emission effect of the surface-emission control photonic crystal by grating couple is made larger in the center portion and smaller in the peripheral portion. As a result, it is possible to output a laser beam having a Gaussian-like field distribution in the in-plane direction. According to the sixth embodiment, the radius of the air holes are exponentially changed depending on a distance from the center portion, so that a light with a Gaussian-like field distribution in the in-plane direction is obtained. However, the size of the air holes may be changed by using other methods depending on a desired shape of a beam.

A two-dimensional photonic crystal surface-emitting laser according to a seventh embodiment of the present invention is described below. In the two-dimensional photonic crystal surface-emitting laser according to the seventh embodiment, similarly to the sixth embodiment, air holes of a surface-emission photonic crystal formed on a GaAs photonic crystal layer have different sizes depending on in-plane positions in the GaAs photonic crystal layer, and the photonic crystal lattice is formed as a triangular-lattice.

Figure 10:
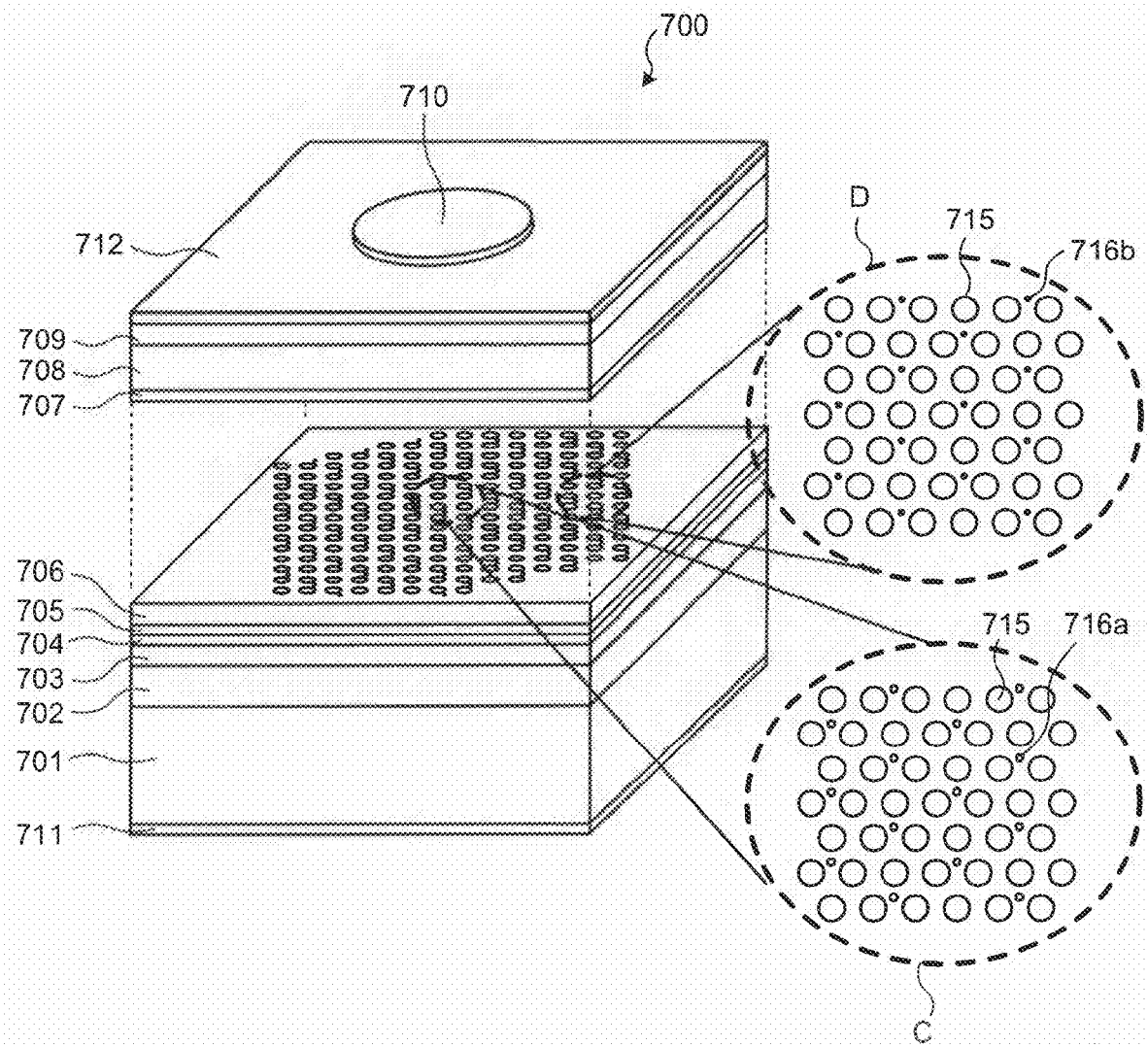
FIG. 10 is an exploded perspective view of a two-dimensional photonic crystal surface-emitting laser according to a seventh embodiment of the present invention.
Figure 11:
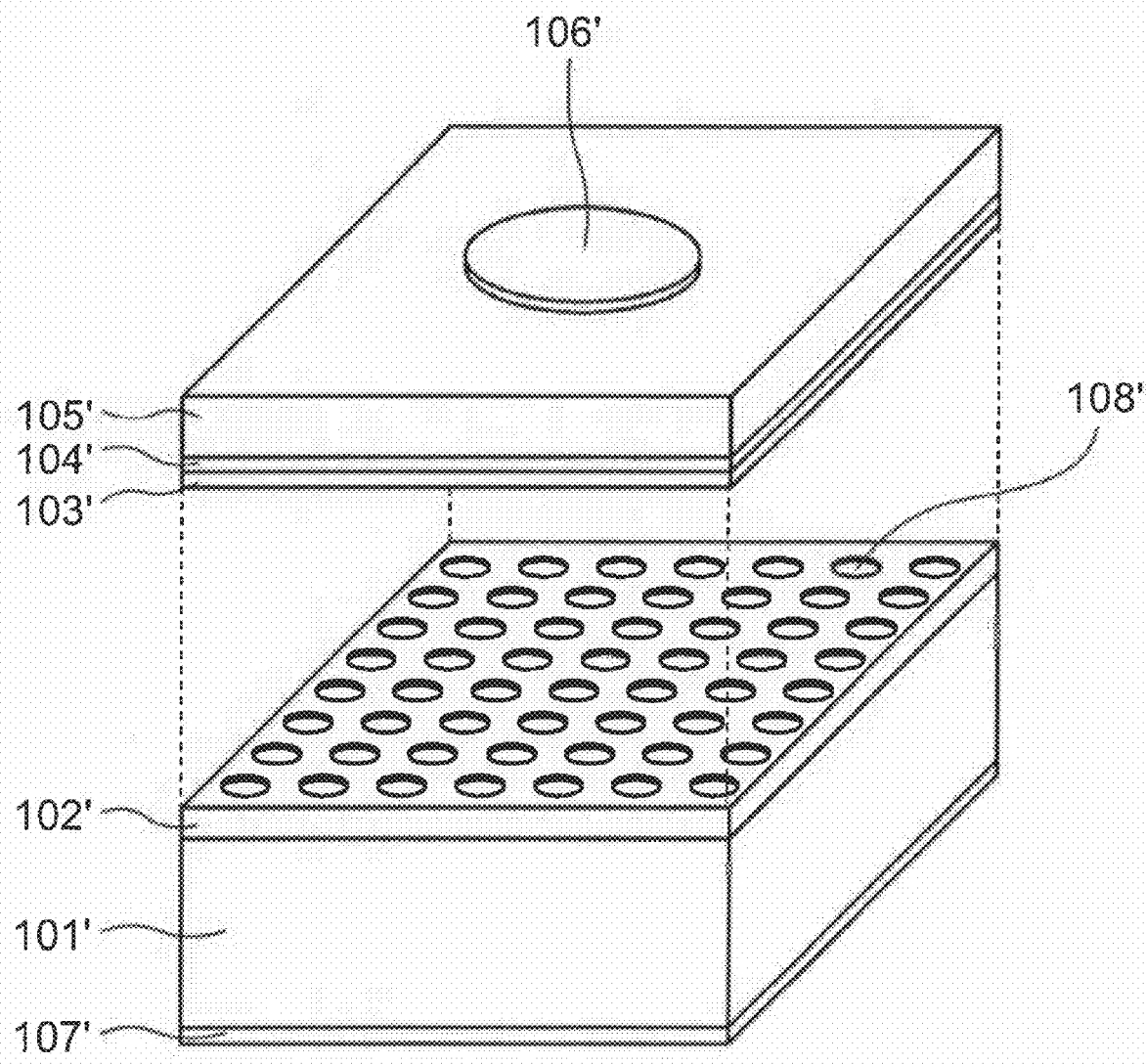
FIG. 11 is an exploded perspective view of a conventional two-dimensional photonic crystal surface-emitting laser.

FIG. 10 is an exploded perspective view of a two-dimensional photonic crystal surface-emitting laser 700 according to the seventh embodiment, wherein an in-plane center portion and a peripheral portion of a GaAs photonic crystal layer 706 are enlarged in dotted-line circles indicated by reference symbols C and D. In the two-dimensional photonic crystal surface-emitting laser 700, air holes 715 that form a distributed-feedback control photonic crystal are formed as a triangular-lattice with a lattice constant equal to that of the air holes 415 in the two-dimensional photonic crystal surface-emitting laser according to the fourth embodiment. A radius of the air hole 715 is 42.7 nanometers which is 0.22 times the lattice constant of the lattice L7, that is, 194 nanometers, and uniform regardless of in-plane positions in the GaAs photonic crystal layer 706.

Air holes 716 of a surface-emission control photonic crystal are formed as a triangular-lattice with a lattice constant equal to that of the air holes 416 in the two-dimensional photonic crystal surface-emitting laser according to the fourth embodiment, and with the same crystal orientation as the fourth embodiment. However, radiuses of the air holes 716 are different depending on the in-plane positions in the GaAs photonic crystal layer 706. In FIG. 10, an enlarged view of the air holes 715 and air holes 716a on a center portion in the in-plane direction of a GaAs photonic crystal layer 706a is shown in a dotted-line circle indicated by a reference symbol C; and an enlarged view of the air holes 715 and air holes 716b on a peripheral portion is shown in a dotted-line circle indicated by a reference symbol D. A radius of the air hole 716b in the peripheral portion of the surface-emission control photonic crystal is smaller than a radius of the air hole 716a in the center portion of the surface-emission control photonic crystal. Specifically, a radius of the air hole in the center portion is 31 nanometers which is 0.16 times the lattice constant of the lattice L7, that is, 194 nanometers, and a radius exponentially decreases with an in-plane distance from the center portion to the peripheral portion. A radius of an air hole on a position 50 micrometers away from the center portion is 15.5 nanometers, which is a half of that of the center portion.

According to the seventh embodiment, similar to the sixth embodiment, by setting the radius of the air holes of the surface-emission control photonic crystal such that the radius of the air holes on the in-plane center portion of the photonic crystal layer are larger than the radius of the air holes on the peripheral portion, the surface emission effect of the surface-emission control photonic crystal by grating couple is made larger in the center portion and smaller in the peripheral portion. As a result, it is possible to output a laser beam having a Gaussian-like field distribution in the in-plane direction. Furthermore, the size of the air holes may be changed by using other methods depending on a desired shape of a beam.

As described above, according to an aspect of the present invention, the distributed-feedback control photonic crystal and the surface-emission control photonic crystal are superimposed one on the other in the two-dimensional photonic crystal surface-emitting laser. Specifically, the distributed-feedback control photonic crystal is configured so that a light that propagates in an active layer as a core is subjected to two-dimensional distributed feedback and the surface-emission control photonic crystal is configured so that the surface emission occurs with the propagated light. Therefore, it is possible to provide the two-dimensional photonic crystal surface-emitting laser in which the two-dimensional feedback effect and the surface emitting property are independently controlled.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A two-dimensional photonic crystal surface-emitting laser comprising:
    an active layer that emits a light with a carrier injection;
    a medium layer formed near the active layer; and
    a two-dimensional photonic crystal formed in the medium layer by arranging a medium having a refractive index different from that of the medium layer in a lattice pattern, wherein
    the two-dimensional photonic crystal includes
        a distributed-feedback control photonic crystal in which a light propagating through the active layer as a core is subjected to a two-dimensional distributed feedback within a plane of the active layer, and the light is not radiated in a direction normal to the plane of the active layer, and
        a surface-emission control photonic crystal in which the light is radiated in the direction normal to the plane of the active layer, and
    the distributed-feedback control photonic crystal and the surface-emission control photonic crystal are superimposed with each other.

2. The two-dimensional photonic crystal surface-emitting laser according to claim 1, wherein
    the distributed-feedback control photonic crystal is formed as a square-lattice with a lattice constant which is $1/\sqrt{2}$ times a mode wavelength of the light, and
    the surface-emission control photonic crystal is formed as a square-lattice with a lattice constant equal to the mode wavelength of the light and with a crystal orientation making an angle of 45 degrees with a crystal orientation of the distributed-feedback control photonic crystal.

3. The two-dimensional photonic crystal surface-emitting laser according to claim 1, wherein
    the distributed-feedback control photonic crystal is formed as a square-lattice such that the light operates at an M-point in a wave number space at a mode wavelength of the light, where the M-point is a symmetrical point represented by $(p+(1/2))b_1+(q+(1/2))b_2$, where p and q are arbitrary integers, and $b_1$ and $b_2$ are reciprocal primitive vectors with minimum magnitudes of the photonic crystal lattice in the wave number space, and
    the surface-emission control photonic crystal is formed as a rectangular lattice such that the light operates at a Γ-point in a wave number space at the mode wavelength of the light, where the Γ-point is a symmetrical point represented by $pb_1+qb_2$.

4. The two-dimensional photonic crystal surface-emitting laser according to claim 1, wherein
    the distributed-feedback control photonic crystal is formed as a triangular-lattice with a lattice constant which is 2/3 times a mode wavelength of the light, and
    the surface-emission control photonic crystal is formed as a triangular-lattice with a lattice constant which is $2\sqrt{3}/3$ times the mode wavelength of the light and with a crystal orientation making an angle of 30 degrees with a crystal orientation of the distributed-feedback control photonic crystal.

5. The two-dimensional photonic crystal surface-emitting laser according to claim 1, wherein
    the distributed-feedback control photonic crystal is formed as a triangular-lattice such that the light operates at a K-point in a wave number space at a mode wavelength of the light, where the K-point is a symmetrical point represented by $(p+(1/3))b_1+(q+(1/3))b_2$ or $(p-(1/3))b_1+(q+(2/3))b_2$, where p and q are arbitrary integers, and $b_1$ and $b_2$ are reciprocal primitive vectors with minimum magnitudes of the photonic crystal lattice in the wave number space, and
    the surface-emission control photonic crystal is formed as a triangular-lattice such that the light operates at a Γ-point in a wave number space at the mode wavelength of the light, where the Γ-point is a symmetrical point represented by $pb_1+qb_2$.

6. The two-dimensional photonic crystal surface-emitting laser according to claim 1, wherein sizes of the medium are different depending on an in-plane position in the medium layer.

7. The two-dimensional photonic crystal surface-emitting laser according to claim 2, wherein sizes of the medium are different depending on an in-plane position in the medium layer.

8. The two-dimensional photonic crystal surface-emitting laser according to claim 3, wherein sizes of the medium are different depending on an in-plane position in the medium layer.

9. The two-dimensional photonic crystal surface-emitting laser according to claim 4, wherein sizes of the medium are different depending on an in-plane position in the medium layer.

10. The two-dimensional photonic crystal surface-emitting laser according to claim 5, wherein sizes of the medium are different depending on an in-plane position in the medium layer.

11. The two-dimensional photonic crystal surface-emitting laser according to claim 6, wherein sizes of the medium decrease exponentially from a center portion to a peripheral portion in the plane direction of the medium layer.

12. The two-dimensional photonic crystal surface-emitting laser according to claim 7, wherein sizes of the medium decrease exponentially from a center portion to a peripheral portion in the plane direction of the medium layer.

13. The two-dimensional photonic crystal surface-emitting laser according to claim 8, wherein sizes of the medium decrease exponentially from a center portion to a peripheral portion in the plane direction of the medium layer.

14. The two-dimensional photonic crystal surface-emitting laser according to claim 9, wherein sizes of the medium decrease exponentially from a center portion to a peripheral portion in the plane direction of the medium layer.

15. The two-dimensional photonic crystal surface-emitting laser according to claim 10, wherein sizes of the medium decrease exponentially from a center portion to a peripheral portion in the plane direction of the medium layer.

* * * * *